US006547934B2

(12) United States Patent
Cohen et al.

(10) Patent No.: US 6,547,934 B2
(45) Date of Patent: Apr. 15, 2003

(54) REDUCTION OF METAL OXIDE IN A DUAL FREQUENCY ETCH CHAMBER

(75) Inventors: Barney M. Cohen, Santa Clara; Gilbert Hausmann, San Jose; Vijay Parkhe, Sunnyvale; Zheng Xu, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/082,746

(22) Filed: May 21, 1998

(65) Prior Publication Data

US 2001/0050265 A1 Dec. 13, 2001

Related U.S. Application Data

(60) Provisional application No. 60/085,854, filed on May 18, 1998.

(51) Int. Cl.[7] ................................................. C25B 5/00
(52) U.S. Cl. .................. 204/157.15; 216/13; 216/78; 148/565
(58) Field of Search .............................. 216/13, 68, 76, 216/78; 148/565, 687, 708

(56) References Cited

U.S. PATENT DOCUMENTS

| 4,028,155 A | * | 6/1977 | Jacob ........................ 156/643 |
| 4,711,698 A | | 12/1987 | Douglas ..................... 156/643 |
| 4,872,947 A | | 10/1989 | Wang et al. ................ 156/643 |
| 5,000,819 A | | 3/1991 | Pedder et al. .............. 156/643 |

(List continued on next page.)

FOREIGN PATENT DOCUMENTS

| DE | 19521150 | 12/1995 | ......... H01L/23/522 |
| DE | 19751785 | 5/1998 | ......... H01L/21/768 |

(List continued on next page.)

OTHER PUBLICATIONS

PCT International Search Report for PCT/US 99/27829, dated Mar. 24, 2000, 7 pages.
Tetsuya Taguwa, Koji Urabe, Makoto Sekine, Yoshiaki Yamada and Takamaro Kikkawa, "Low Contact Resistance Metallization for Gigabit Scale DRAM's Using Fully–Dry Cleaning by Ar/$H_2$ ECR Plasma," IEEE Transactions on Electron Devices, vol. 44, No. 4, Apr. 1997, pp. 588–593.
PCT International Search Report for PCT/US 99/09986, dated Aug. 27, 1999, 3 pages.
PCT International Search Report dated Aug. 12, 1999.
Sawada, et al., "The reduction of copper oxide thin films with hydrogen plasma generated by a n atmospheric–pressure glow discharge", J. Phys. 29 (1996), pp. 2539–2544.

Primary Examiner—Anita Alanko
Assistant Examiner—Allan Olsen
(74) Attorney, Agent, or Firm—Moser, Patterson & Sheridan

(57) ABSTRACT

The invention generally provides an apparatus and a method of removing metal oxides, particularly copper oxides and aluminum oxides, from a substrate surface. Primarily, the invention eliminates sputtering of copper oxide from the bottom of an interconnect feature onto the side walls of an interconnect feature, thereby preventing diffusion of the copper atom through the dielectric material and degradation of the device. The invention also eliminates sputtering of the copper oxides onto the chamber side walls that may eventually flake off and cause defects on the substrate. The method of reducing metal oxides from a substrate surface comprises placing the substrate within a plasma processing chamber, flowing a processing gas comprising hydrogen into the chamber, and maintaining a plasma of the processing gas within the chamber through inductive coupling. The method is preferably performed using a dual frequency etch chamber wherein adjustments are made in the processing gas flow, the RF powers and the exhaust pumping speeds to eliminate sputtering of the copper oxide and to maximize the reduction reaction.

13 Claims, 2 Drawing Sheets

U.S. PATENT DOCUMENTS

| | | | |
|---|---|---|---|
| 5,232,871 A | 8/1993 | Ho | 437/190 |
| 5,248,636 A | 9/1993 | Davis et al. | 437/225 |
| 5,266,154 A | 11/1993 | Tatsumi | 156/643 |
| 5,409,543 A | 4/1995 | Panitz et al. | 134/2 |
| 5,423,941 A | 6/1995 | Komura et al. | 156/643.1 |
| 5,424,246 A * | 6/1995 | Matsuo et al. | 437/192 |
| 5,458,907 A | 10/1995 | Ishido | |
| 5,476,182 A | 12/1995 | Ishizuka et al. | 216/68 |
| 5,527,718 A | 6/1996 | Seita et al. | 437/11 |
| 5,572,072 A | 11/1996 | Lee | 257/751 |
| 5,607,542 A * | 3/1997 | Wu et al. | 156/643.1 |
| 5,643,834 A | 7/1997 | Harada et al. | |
| 5,660,682 A | 8/1997 | Zhao et al. | 438/715 |
| 5,674,373 A | 10/1997 | Negrerie et al. | |
| 5,725,938 A | 3/1998 | Jin et al. | |
| 5,726,097 A | 3/1998 | Yanagida | 438/622 |
| 5,843,847 A | 12/1998 | Pu et al. | 438/723 |
| 5,877,087 A | 3/1999 | Mosely et al. | 438/656 |
| 5,899,720 A | 5/1999 | Mikagi | 438/303 |
| 5,950,083 A | 9/1999 | Inoue et al. | 438/233 |
| 5,970,378 A | 10/1999 | Shue et al. | 438/656 |
| 6,033,537 A | 3/2000 | Suguro | 204/192.2 |
| 6,037,257 A * | 3/2000 | Chiang et al. | 257/762 |
| 6,107,192 A * | 8/2000 | Subrahmanyan et al. | 438/637 |

FOREIGN PATENT DOCUMENTS

| | | | |
|---|---|---|---|
| EP | 0430303 | 6/1991 | H01L/21/285 |
| EP | 0 520 519 A1 | 12/1992 | H01J/37/32 |
| EP | 0553961 | 8/1993 | H01L/21/311 |
| EP | 0849779 | 6/1998 | H01L/21/306 |
| FR | 2 712 119 | 5/1995 | H01L/21/306 |
| GB | 2 283 461 A | 5/1995 | C04B/41/53 |
| GB | 2290166 | 12/1995 | H01L/21/3213 |
| GB | 2319532 | 5/1998 | C23C/14/58 |
| GB | 2319533 | 5/1998 | C23C/14/58 |
| JP | 05235541 | 9/1993 | H05K/3/38 |
| JP | 06097111 | 4/1994 | H01L/21/28 |

* cited by examiner

REDUCTION OF METAL OXIDE IN A DUAL FREQUENCY ETCH CHAMBER

This application claims the benefit of U.S. Provisional Application No. 60/085,854, filed May 18, 1998.

BACKGROUND OF THE INVENTION

1. Field of the Invention

The present invention generally relates to etch chambers. More particularly, the present invention relates to a process for cleaning copper oxides from a substrate using an etch chamber.

2. Background of the Related Art

As integrated circuit (IC) dimensions become increasingly smaller, the interface contact resistance between interconnect layers becomes significantly important. A particular contact resistance problem involves metal oxides that form when the substrate is exposed to air during the fabrication process. In the past, sputter etching has been utilized successfully to remove many metal oxides. However, as device dimensions and interconnect features shrink, sputter etching has become inadequate for removing metal oxides, particularly copper oxides, within the smaller interconnect features.

In order to fabricate a complete IC, typically several substrate processing systems are used, with each system performing a particular step or series of steps in the overall fabrication process. The substrates are transferred between the systems at ambient conditions. The ambient environment is maintained very clean to prevent contamination of the substrates as they are transferred between systems. The substrates may even be transferred in completely enclosed cassettes in order to further prevent contamination thereof. A problem, however, is that oxygen in the ambient air form oxides on the surfaces of the substrates, and in the case of copper deposits, copper oxides form on the surface of the deposited copper film. The surface oxide creates an interface having a high contact resistance with a subsequently deposited metal film and degrades the device performance because of the excess interface resistance. Thus, the surface oxides need to be removed or etched from the surfaces of the substrates, in a pre-processing cleaning or pre-clean step, before the substrates are subjected to subsequent processing, in order to assure a very low interface resistance with a subsequently deposited layer.

A pre-clean chamber cleans the surface of the substrate by removing the undesired layer of oxides. FIG. 1 is a simplified cross sectional view of a pre-clean chamber. Generally, the pre-clean chamber 10 has a substrate support member 12 disposed in a chamber enclosure 14 under a quartz dome 16. The substrate support member 12 typically includes a central pedestal plate 18 disposed within a recess 20 on a quartz insulator plate 22. The upper surface of the central pedestal plate 18 typically extends above the upper surface of the quartz insulator plate 22. A gap 24, typically between about 5 mils and 15 mils, is formed between a bottom surface of the substrate 26 and the top surface of the quartz insulator plate 22. During processing, the substrate 26 is placed on the central pedestal plate 18 and located thereon by positioning pin 32. The peripheral portion of the substrate 26 extends over the quartz insulator plate 22 and overhangs the upper edge of the quartz insulator plate 22. A beveled portion 28 of the quartz insulator plate 22 is disposed below this overhanging peripheral portion of the substrate 26, and a lower annular flat surface 30 extends from the lower outer edge of the beveled portion 28. The insulator plate 22 and the dome 16 may comprise other dielectric materials, such as aluminum oxide and silicon nitride, and the insulator plate 22 and the dome 16 are typically parts of a process kit that system operators periodically replace during routine maintenance. It is desirable that a process kit has a long useful lifetime so that the downtime of the system will be a small percentage of the overall processing time.

The process for cleaning the substrate 26 in the pre-clean chamber 10 generally involves a sputter-etching process using the substrate 26 as the sputtering target. Generally, a cleaning gas such as argon is flowed through the chamber 10, and a plasma is struck in the chamber with a bias power applied to the substrate 26 in the range of about 150 W to about 450 W. Additionally, a RF power is applied to the chamber through coils disposed outside of the chamber. A DC bias of about −100 V to about −600 V, with a bias power of about 100 W to about 300 W, accelerates the ions toward the substrate 26. The pressure in the pre-clean chamber 10 during sputtering is typically between about 0.4 mTorr and about 0.5 mTorr. Under these conditions, the pre-clean chamber 10 can typically remove about 150 Å to about 450 Å of the oxidized material at an etch rate of about 300 Å/min to about 600 Å/min. Typically, about 400 Å or less of oxidized material is removed from the surface of the substrates.

The primary purpose of the etch cleaning is to remove the oxidized materials that form on the surface of the substrate typically when the substrate was subjected to ambient air conditions while being transported between processing chambers of a processing system or from one processing system to another processing system. For cleaning of copper oxides that form on the surface of a deposited copper film on a silicon substrate, the substrate is processed in the pre-clean chamber 10 as described above. The etched material (i.e., copper oxides) sputters off the substrate surface and forms a film on the process kit. As the film forms on the process kit surfaces, its density may change, resulting in stress on the film. This stress, along with differences in the coefficients of expansion of the materials in the film and the process kit surfaces, can result in delamination, or flaking, of the film from the surface of the process kit and contamination of the substrate being processed. Because these particles can seriously damage the substrates and/or cause defects to form on the substrates, the process kit is typically replaced after a certain number of substrates have been cleaned in the system. However, replacement of the process kit is time consuming and reduces throughput of the system. Additionally, as long as a film is formed on the surfaces of the process kit, there is a risk of flakes of material falling onto a substrate and damaging the devices formed on the substrate.

Furthermore, where the copper oxide is formed on the bottom surface of an interconnect feature, such as a contact or a via, some of the sputtered copper oxide from the bottom of the interconnect feature deposits onto the side wall of the interconnect feature. The copper from the copper oxide may diffuse through the dielectric material that forms the side wall of the interconnect feature and degrade the device performance. Also, when a subsequent layer or a barrier layer, such as tantalum (Ta) or tantalum nitride (TaN), is deposited over the surfaces within the interconnect feature where the copper oxide has deposited, the film quality of the subsequent layer is compromised or degraded by the copper oxide that sputtered onto the side walls of the interconnect feature.

Therefore, there exists a need for an apparatus and a method of removing metal oxides, particularly copper oxides, from a substrate surface that prevents sputtering of copper oxides from the bottom of an interconnect feature onto the side walls of an interconnect feature. Furthermore, there is a need to eliminate sputtering of the copper oxides onto the process kit that may eventually flake off and cause defects on the substrate.

SUMMARY OF THE INVENTION

The invention generally provides an apparatus and a method of removing metal oxides, particularly copper oxides and aluminum oxides, from a substrate surface. Primarily, the invention eliminates sputtering of copper oxide from the bottom of an interconnect feature onto the side walls of an interconnect feature, thereby preventing diffusion of the copper atom through the dielectric material and degradation of the device. The invention also eliminates sputtering of the copper oxides onto the chamber side walls that may eventually flake off and cause defects on the substrate.

The method of reducing metal oxides from a substrate surface comprises placing the substrate within a plasma processing chamber, flowing a processing gas comprising hydrogen into the chamber, and maintaining a plasma of the processing gas within the chamber through inductive coupling. Preferably, the processing gas comprises about 5% or less hydrogen premixed with an inert carrier gas, such as helium or nitrogen. The method is preferably performed using a dual frequency etch chamber wherein adjustments are made in the processing gas flow, the RF powers and the exhaust pumping speeds to eliminate sputtering of the copper oxide and to maximize the reduction reaction.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
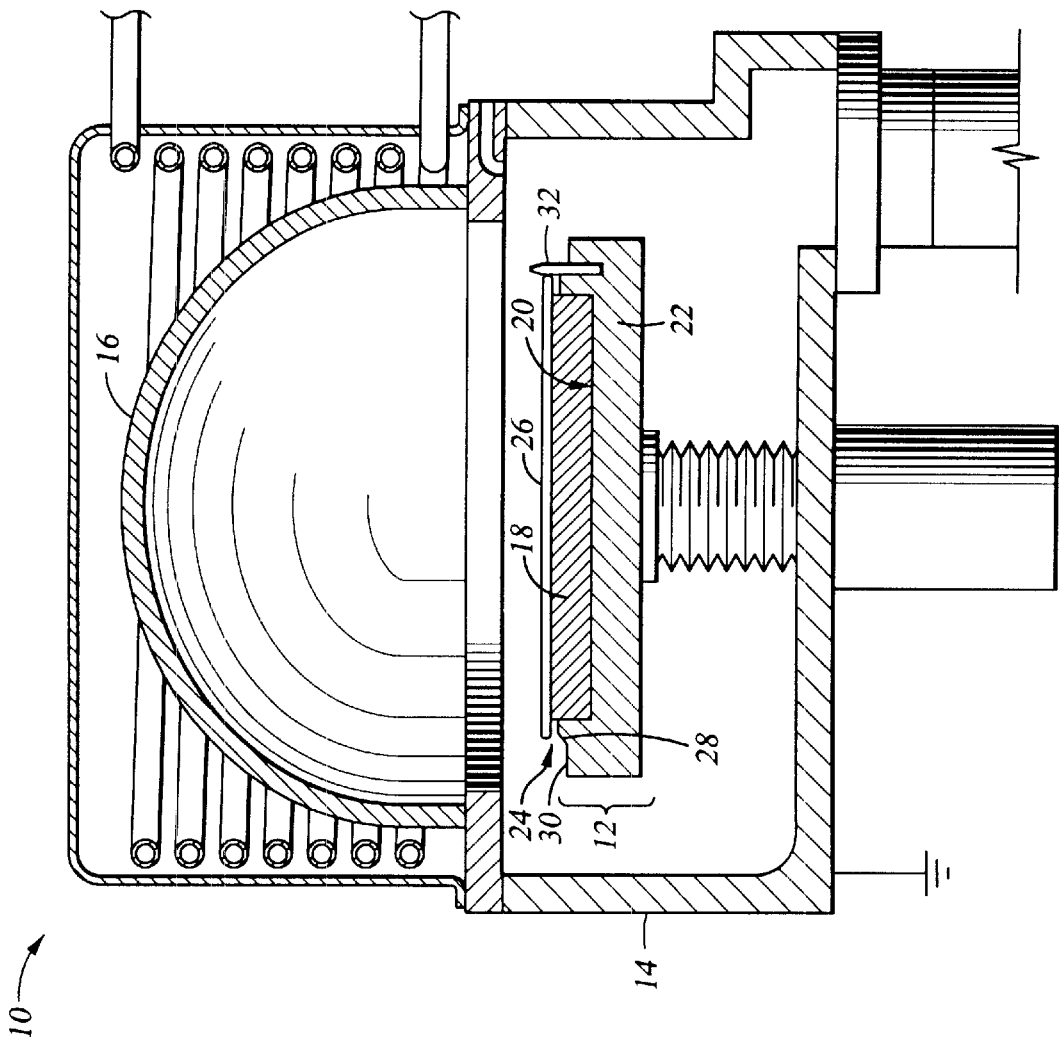
FIG. 1 is a simplified cross sectional view of a pre-clean chamber.
Figure 2:
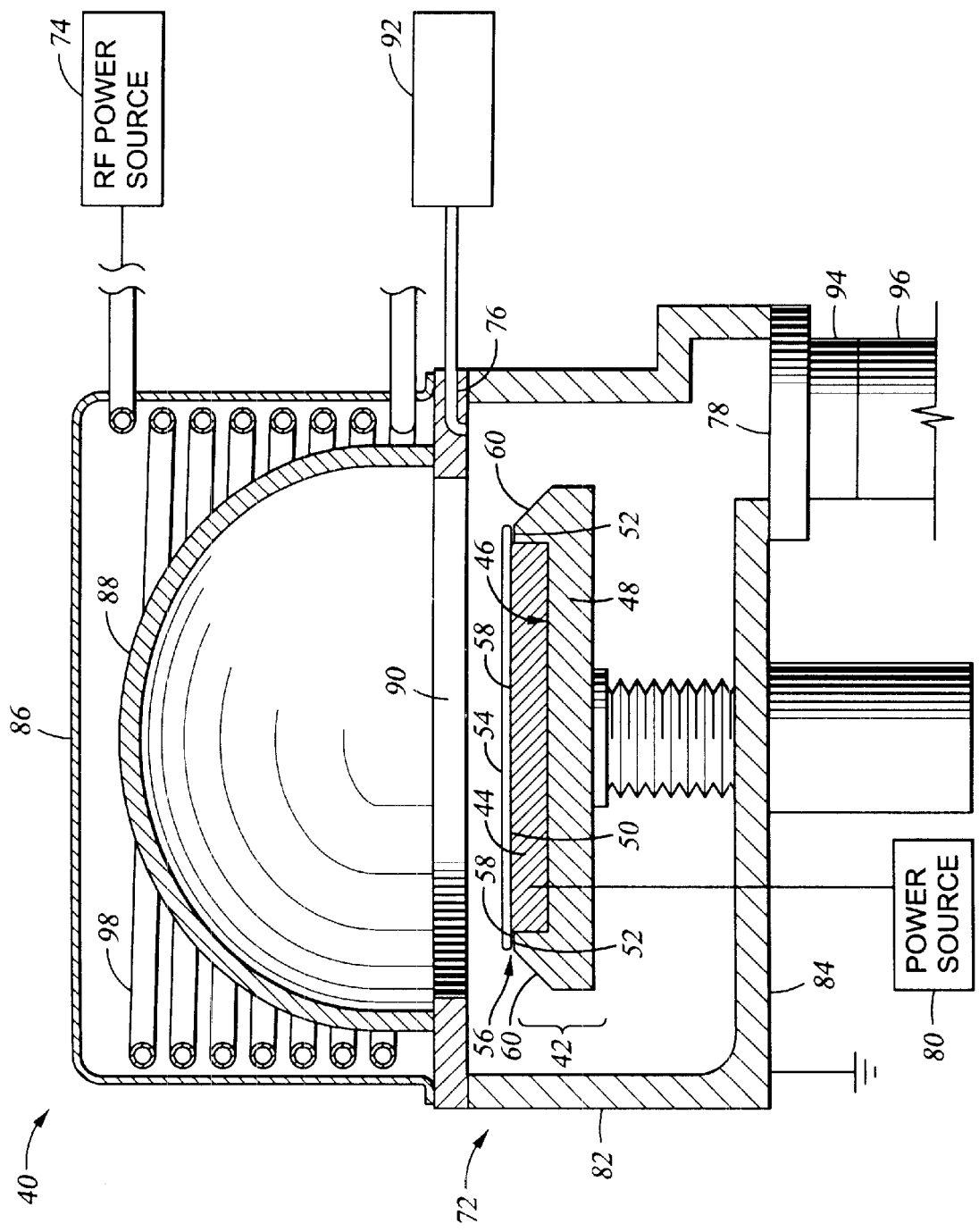
FIG. 2 is a cross sectional view of a pre-clean chamber according to the invention.

FIG. 2 is a cross sectional view of an etch/pre-clean chamber 40 according to the invention. The etch/pre-clean chamber 40 is preferably a dual frequency etch chamber such as the Pre-Clean II Chamber available from Applied Materials, Inc., Santa Clara, Calif. Generally, the etch/pre-clean chamber 40 comprises an enclosure 72, a substrate support 42 disposed within the chamber, a gas inlet 76 connected to the enclosure, a gas exhaust 78 connected to the enclosure, an RF power source 74 connected to an inductive coil 98 to generate a plasma within the enclosure, and a power source 80 connected to the substrate support member 42.

The enclosure 72 includes side walls 82, a bottom 84 and a top 86. A quartz dome 88 is disposed under the top 86 and above a processing region 90. The quartz dome 88 is typically part of a replaceable process kit that is replaced after a certain number of substrates have been processed in the chamber. An inductor coil 98 is disposed around the quartz dome 88 and connected to an RF power source 74 to inductively couple a plasma within the processing region 90.

The gas inlet 76 is connected to a processing gas supply 92 and introduces the processing gas into the chamber 40 during processing. The gas exhaust 78 preferably comprises a servo control throttle valve 94 and a vacuum pump 96. The vacuum pump 96 evacuates the chamber 40 prior to processing. During processing, the vacuum pump 96 and the servo control throttle valve 94 maintain the desired pressure within the chamber 40 during processing.

The substrate support member 42 generally comprises a pedestal plate 44 disposed within a recess 46 on a top surface of a quartz insulator plate 48. The top surface 50 of the pedestal plate 44 extends slightly higher than the upper annular surface 52 of the quartz insulator plate 48 and is in contact with a central portion of the bottom surface or backside 58 of the substrate 54. Preferably, the pedestal plate 44 comprises titanium and is connected to a power source 80 to provide the necessary bias for processing. The peripheral portion of the substrate 54 extends above the upper annular surface 52 of the quartz insulator plate 48 and forms a gap 56 between the bottom surface 58 of the substrate 54 and the upper annular surface 52 of the quartz insulator plate 48. Preferably, the gap 56 has a height between about 5 mils and about 15 mils to prevent plasma from reaching the backside of the substrate. The outer edge of the upper annular surface 52 of the quartz insulator plate 48 has a diameter at least as great as the diameter of the outer edge of the substrate 54, and the backside 58 of the substrate 54 is practically covered.

A beveled portion 60 of the quartz insulator plate 48 extends from the outer edge of the upper annular surface 52 in a downward slope. Preferably, the slope of the bevel is between about 10 degrees and about 60 degrees from a horizontal plane. As shown in FIG. 2, the slope is about 45 degrees. Optionally, the substrate support member 42 includes a temperature controller or a heater (not shown) to control the temperature of the substrate during processing.

In operation, the substrate 54 is positioned on the substrate support member 42, and the chamber 40 is evacuated to provide a vacuum processing environment. A processing gas comprising hydrogen ($H_2$) is introduced through the gas inlet 76 into the processing region 90. The processing gas may comprises between 0% and 100% hydrogen. Preferably, the processing gas comprises about 5% or less hydrogen premixed with an inert carrier gas that does not cause sputter etching of the copper oxide or copper. This hydrogen concentration is selected for safety concerns. Examples of the inert carrier gas include helium and nitrogen. When the processing gas comprises more than 5% hydrogen, the processing gas is preferably introduced through a gas box (not shown) attached to the chamber that separates the different gases until the gases are introduced into the chamber. Alternatively, bottled gases (not shown) can be used as the processing gas supply. Preferably, the processing gas is flowed into the chamber at between about 10 sccm and about 1000 sccm, and more preferably, at about 100 sccm.

To activate the reaction, a plasma of the processing gas is generated in the processing region through inductive coupling and/or capacitive coupling. The initial plasma is preferably struck by biasing the substrate support member 42 between about 1 W and about 100 W and between about 100 KHz and about 100 MHz for about 3 seconds. Alternatively, the initial plasma is generated by applying power to the inductive coil 98. During the reduction reaction period, the inductive coil 98 is biased between about 1 W and about 1000 W at between about 100 KHz and about 60 MHz to sustain a plasma in the processing region inductively while the substrate support member 42 is biased between about 0 W and about 100 W to sustain the plasma capacitively. Alternatively, during the reduction reaction period, the plasma in the processing region is sustained solely by the inductive coil 98. It is contemplated by the inventors that the plasma within the processing region may be excited and sustained during processing by inductive coupling only, capacitive coupling only or combinations of both inductive and capacitive coupling.

The chamber pressure is initially built up to the desired processing pressure by setting the servo control throttle valve 94 to a partially closed state. During processing, the chamber pressure is preferably maintained between about 20 mTorr and about 100 mTorr by controlling the open/closed state of the servo control throttle valve 94. A number of operating parameters are adjusted to eliminate sputtering of the copper oxides by the ions in the plasma and to maximize the reduction reaction. These operating parameters include the power supplied to the inductive coil and the substrate support, the hydrogen concentration and flow rate of the processing gas, the pressure within the processing region, and the density of the resulting plasma. Optionally, the temperature of the substrate 54 during processing is controlled by a heater within the substrate support member 42 to enhance or to activate the reduction reaction for some metal oxides. However, for the reduction reaction of copper oxide, it is not necessary to heat the substrate to a particular temperature.

During the reduction reaction process, the hydrogen ions within the plasma react with the copper oxide to form metallic copper and water vapor as in Equation (1).

$$Cu_2O + H_2 \rightarrow 2Cu + H_2O(vapor) \quad \text{Equation (1)}$$

The chemical reaction reduces the copper oxide and leaves metallic copper where the copper oxide previously occupied. Thus, no sputtering of the copper oxide occurs during processing, and no unwanted copper oxide is left within the interconnect feature.

Preferably, after the desired processing time and the reduction of copper oxide to copper, the power to the inductive coil 98 is continued, and the power supplied to the substrate support member 42 is reduced to about 1 W. This step reduces particle generation as the reduction reaction period ends. Subsequently, the servo control throttle valve 94 is opened fully, and the powers supplied to the inductive coil 98 and substrate support member 42 are turned off. The process gas flow over the substrate 54 is then increased to perform a final substrate surface conditioning step to reduce any static charges that may have built up during the process. After the final conditioning step, the processing gas supplied into the chamber is shut off, and the chamber is evacuated of the remaining processing gas. The substrate 54 is then transferred out of the etch/pre-clean chamber 40 for other processes to be performed in other processing chambers.

The invention provides the advantage of removing copper oxide from a high aspect ratio interconnect feature without sputtering of the copper oxide onto the side wall of the interconnect feature. The invention also provides the advantage of using a dual frequency etch chamber that can be incorporated into many existing semiconductor processing system operating at a subatmospheric pressure environment.

The dual frequency etch chamber utilizes both capacitive coupling and inductive coupling to generate and/or maintain a plasma during processing and provides a processing chamber that is less likely to damage the substrate and the devices formed thereon, as compared to an atmospheric-pressure glow discharge processing chamber, for example, because the plasma is maintained by inductive coupling rather than capacitive coupling. The invention further provides the advantage of conducting the reduction reaction process at room temperature, or alternatively, at a particular temperature as provided by a temperature controller incorporated within the substrate support. Furthermore, the invention provides a servo-controlled throttle valve for maintaining accurate sub-atmospheric pressure environment.

While the foregoing is directed to the preferred embodiment of the present invention, other and further embodiments of the invention may be devised without departing from the basic scope thereof. The scope of the invention is determined by the claims which follow.

What is claimed is:

1. A method for reducing copper oxides, comprising:
   a) placing a substrate comprising a copper oxide within a plasma processing chamber;
   b) flowing a processing gas comprising about 5% or less hydrogen and helium into the chamber; and
   c) maintaining a plasma of the processing gas within the chamber through inductive coupling.

2. The method of claim 1, further comprising:
   d) maintaining a chamber pressure between about 20 mTorr and about 100 mTorr.

3. The method of claim 2 wherein the chamber pressure is maintained by a servo control throttle valve on a gas exhaust of the chamber.

4. The method of claim 1 wherein the plasma is maintained by an induction coil operating between about 1 W and about 1000 W.

5. The method of claim 4 wherein the inductor coil is operating between about 100 KHz and about 60 MHz.

6. The method of claim 1 wherein the substrate is placed on a substrate support within the chamber.

7. The method of claim 6 wherein the substrate support is biased between about 0 W and about 100 W.

8. The method of claim 6 wherein the substrate support is biased between about 100 KHz and about 100 MHz.

9. The method of claim 6 wherein the substrate support controls a temperature of the substrate.

10. The method of claim 1 wherein the processing gas is flowed between about 10 sccm and about 1000 sccm.

11. The method of claim 1, further comprising a conditioning step to reduce static charges.

12. The method of claim 11, wherein a power supplied to the substrate support is reduced during the conditioning step.

13. A method for reducing copper oxides, comprising:
   a) placing a substrate comprising a copper oxide within a plasma processing chamber;
   b) flowing a processing gas comprising hydrogen and helium into the chamber; and
   c) maintaining a plasma of the processing gas within the chamber through inductive coupling, wherein the method is performed at about room temperature.

* * * * *

UNITED STATES PATENT AND TRADEMARK OFFICE
CERTIFICATE OF CORRECTION

PATENT NO.    : 6,547,934 B2                                          Page 1 of 1
DATED         : April 15, 2003
INVENTOR(S)   : Cohen et al.

It is certified that error appears in the above-identified patent and that said Letters Patent is hereby corrected as shown below:

<u>Column 6,</u>
Line 6, please change "glow" to -- flow --.

Signed and Sealed this

Fourth Day of November, 2003

JAMES E. ROGAN
*Director of the United States Patent and Trademark Office*